United States Patent [19]

Berliner et al.

[11] Patent Number: 4,703,259
[45] Date of Patent: Oct. 27, 1987

[54] FORWARD AND REFLECTED POWER MEASUREMENT AND DISPLAY

[75] Inventors: Shlomo Berliner, Tikva; Areyh Vered, Tev Aviv; Reich Shmuel, Reshon Lezion; Moshe Vaige, Natanya, all of Israel

[73] Assignee: Motorola, Inc., Schaumburg, Ill.

[21] Appl. No.: 774,275

[22] Filed: Oct. 17, 1985

[51] Int. Cl.$^4$ ............................................. G01R 19/10
[52] U.S. Cl. .................................. 324/95; 324/140 R; 340/661; 340/753; 340/754; 364/483; 455/115
[58] Field of Search ................. 340/661, 753, 754; 455/115; 324/95, 96, 103 P, 114, 140 R; 364/483

[56] References Cited

U.S. PATENT DOCUMENTS 2,177,938 10/1939 Hamilton ..................... 340/753 X
4,486,747 12/1984 Okamoto et al. .................. 340/753

FOREIGN PATENT DOCUMENTS 122915 9/1981 Japan ................................. 340/753
33010 2/1985 Japan ............................. 324/103 P

OTHER PUBLICATIONS

Jarman, H., "Simultaneous Display of Two Variables", Electronic Product Design, Sep. 1981, p. 22.

Primary Examiner—Reinhard J. Eisenzopf
Assistant Examiner—Stephen M. Baker
Attorney, Agent, or Firm—Thomas G. Berry

[57] ABSTRACT

A device for displaying forward and reflected power values simultaneously comprises a plurality of display segments which are switched on in a predetermined sequence to display the forward power and switched off in a predetermined sequence to display the reflected power.

17 Claims, 3 Drawing Figures t (SEC)

FORWARD AND REFLECTED POWER MEASUREMENT AND DISPLAY

FIELD OF INVENTION

This invention relates to a device for displaying the magnitude of two parameters, one of which is always less than or equal to the other, and more particularly for displaying the magnitude of forward and reflected radio frequency power at an antenna and to the measurement thereof.

BACKGROUND ART

It is known to measure the forward and reflected power at the aerial of a radio transmitter and to provide the operator with an indication of the appropriate values. However, it has been necessary to use either two separate displays to distinguish between forward and reflected power or to provide a single display. and a switch for enabling an operator to switch the display between indications of forward and reflected power. These known methods therefore make it relatively difficult for an operator to obtain full information concerning the operational status of the radio, antenna tuner and antenna system in a convenient and self explanatory manner.

Furthermore, when the output includes a voice signal, the RF power envelope corresponding to the voice signal has maxima at syllables and minima at intervals between syllables or between words. Rapid changes in the peak envelope power can cause rapid changes in the display of the power value and this can make it difficult for the operator to see and/or understand the display.

BRIEF DESCRIPTION OF THE INVENTION

Thus, this invention seeks to provide a display for forward and reflected power values and measuring apparatus therefor in which the above mentioned disadvantages are mitigated.

In accordance with one aspect of the invention there is provided a display for displaying the magnitude of two parameters, a first one of which is always less than or equal to the second parameter, the device comprising a plurality of display segments each having a first and a second display state, the segments being changed from a first state to a second state in a pre-determined sequence in response to increasing values of said first parameter, a pre-determined sequence of segments being changed from the second to the first display state in response to increasing values of said second parameter whereby simultaneously to indicate the magnitude of both parameters.

In a preferred embodiment, the said first parameter is forward radio frequency power measured at the antenna of a radio transmitter and the said second parameter is reflected power measured at the antenna.

Conveniently, the display segments are liquid crystal display segments, although they may alternatively be light emitting diodes. The first display state is preferably the "off" state and the second display state is preferably the "on" state.

In accordance with a second aspect of the invention there is provided a measuring circuit for measuring the magnitude of a parameter whose value is to be displayed, comprising sampling means for sampling the value of the parameter at predetermined intervals, a first comparing means for comparing the sampled value with a currently displayed value to provide an indication of the change in value, a second comparing means comparing said change in value with a predetermined maximum change and for limiting changes in displayed values to not more than said predetermined maximum.

A preferred embodiment further includes means for measuring the parameter and providing an indication of its instantaneous value, these values then preferably being sampled to determine the maximum value from a group of said instantaneous values, the maximum value then being compared with the currently displayed value by said first comparing means.

The first comparing means preferably determines whether the sampled value is greater than, less than or equal to the currently displayed value. Preferably, the second comparing means then compares an increasing change with a predetermined maximum increasing change and a decreasing change with a predetermined maximum decreasing change. The predetermined maximum increasing change may be equal to the maximum decreasing change but need not be, if, for example, it is desired to have different attack and decay times.

Preferably a microprocessor constitutes one or more of said sampling means and said first and second comparing means.

The measuring circuit may also include an analogue-to-digital converter for converting the measurements of the parameter to digital values for passing to the microprocessor.

In a preferred embodiment the parameter is forward radio frequency power at the antenna of a radio transmitter and may, if desired, also include the reflected power.

If the values are displayed on a segmented display, then the predetermined maximum change may be a predetermined number of segments.

Preferably said predetermined maximum change level is one segment.

BRIEF DESCRIPTION OF DRAWINGS

An exemplary embodiment of the invention will now be described with reference to the drawings in which.

DETAILED DESCRIPTION OF THE INVENTION

Figure 1:
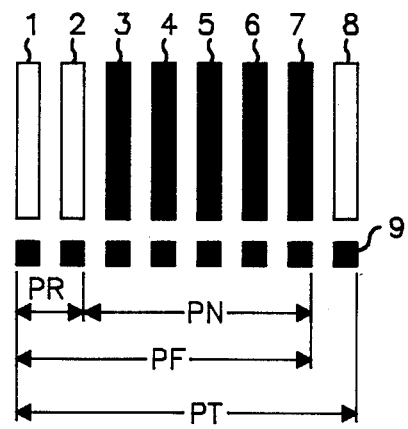
FIG. 1 illustrates a display in accordance with a first aspect of the present invention.

Refering to FIG. 1 there is shown an embodiment of a forward and reflected power display in accordance with the present invention and which is in the form of a liquid crystal bar chart display. The liquid crystal bar chart comprises eight equal rectangle segments 1 to 8 inclusive. A row of eight small square display segments 9 is located underneath the row of rectangular segments and indicates the full available power range.

When the PTT button of the radio transmitter is pressed all the square segments 9 turn ON i.e. change from a first to a second display. state indicating both that the transmitter has been turned ON and also displaying the full power range PT.

As the value of the transmitter forward power PF increases a proportional number of the rectangular segments from left to right, as viewed, is turned ON i.e. is changed from a first to a second display state, while increasing reflected power PR turns OFF, i.e. changes from the second to the first display state, a proportional number of rectangular segments as viewed from left to right.

As shown in the drawing the segments referenced 1 to 7 inclusive are caused to be turned ON by the forward power PF whilst the segments 1 and 2 are turned OFF by the value PR of reflected power.

As a result the segments 3, 4, 5, 6 and 7 remain turned ON and provide an indication of the net power, PN delivered to the antenna, PN being the difference between the values of the forward power PF and the reflected power PR.

Figure 2:
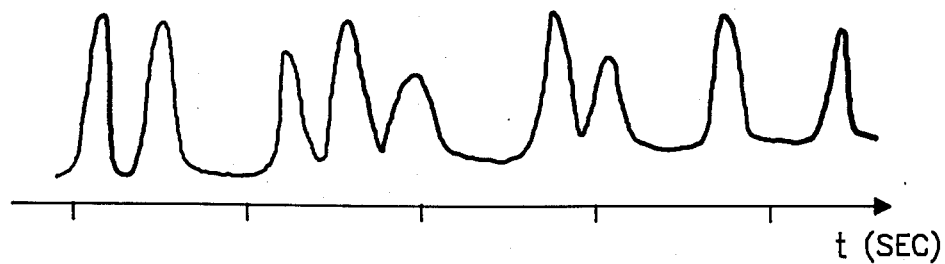
FIG. 2 shows the RF power envelope for a typical radio transmitter and FIG. 3 illustrates a block diagram of a measuring circuit in accordance with a second aspect of the present invention and suitable for driving the display of FIG. 1.

The ouput power of a radio transmitter which is fed to an antenna has an envelope which corresponds to the voice signal producing it. This envelope has maxima at syllables and minima at intervals between syllables or between words. This is illustrated in FIG. 2 of the drawings in which peak envelope power is shown plotted against time in seconds.

As already described, the display indicates the peak envelope power values for both forward and reflected power. With such an indication the transmitter operator can estimate the performance of the power amplifier of the transmitter and the matching between the radio and the antenna system. However in view of the typical envelope illustrated in FIG. 2 such rapid changes in output peak envelope power could cause rapid changes of the display. Consequently an operator may find it difficult to see and understand the fast moving display.

Figure 3:
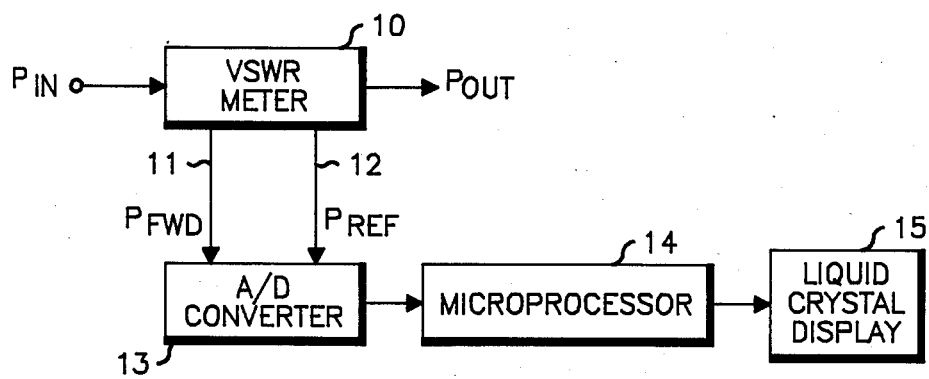

Thus, a measuring circuit such as that shown in FIG. 3 is used for measuring forward and reflected power and for driving the display in such a manner as to prevent large rapid fluctuations in the display.

The measuring circuit comprises a voltage standing wave ratio meter 10 which is located in the power path between the harmonic filter and the antenna of the transmitter. The meter 10 measures the forward and the reflected power and these values are fed over lines 11 and 12 respectively to an analogue to digital converter 13 which converts the analogue measurements of forward and reflected power to digital values. The digital values provided by the analogue to digital converter 13 are fed to a microprocessor 14 which is coupled to drive the liquid crystal drive display 15.

The microprocessor goes through the following procedure for measuring the forward power:

Step 1: Sample the forward power at predetermined intervals, e.g. every 12 milliseconds.

Each sample constitutes a number of display segments proportional to the forward power.

Step 2: Successive samples e.g. eight samples, constitute a group.

Select the largest sample (MS) in the group.

Step 3: Compare this maximum sample (MS) with the maximum value (MD) currently being displayed (derived from the maximum of the previous group. This comparing operation occurs as follows:

a. If MS>MD and MS−MD≧MRI, where MRI is an arbitrarily selected maximum rate increase (e.g. 1 segment)

Then MD′=MD +MRI where MD′ is the new display b. If MS>MD and MS−MD<MRI
Then MD′=MS c. If MS<MD and MD−MS≧MRD, where MRD is an arbitrarily selected maximum rate of decrease (e.g. 1 segment)
Then MD′=MD−MRD d. If MS<MD and MD−MS<MRD
Then MD′=MS e. If MS =MD
Then MD′=MD It will be apreciated that an exactly analogous procedure is followed for measuring the reflected power.

Thus, in the embodiment described the microprocessor samples the instantaneous values of forward and reflected power every 12 milliseconds and selects the maximum readings from a group of eight samples. This maximum reading corresponds to a number, in the present case from zero to eight, of rectangular segments of the display which are to be turned ON.

The microprocessor then compares this number to the previous number of turned ON segments. If the difference between the two numbers is more than or equal to one segment the previous number is updated so as not to produce a change in the display of more than one segment and this new number becomes the new number of segments to be displayed.

Consequently the display is prevented from undergoing large fluctuations which would render it dificult to read.

The invention has been described by way of example and modifications may be made without departing from the scope of the invention. For example, the display need not necessarily be a liquid crystal display but could be any suitable display type and also the segments need not be rectagular in shape but could be of any suitable form, for example segments of a circular display. Also the particular sampling and updating method used by the microprocesser is exemplary and any suitable software programe for control of the updating could be utilised.

The use of the microprocessor to control the display performs slow smoothing of the power envelope and enables the easy controlling of the slope of the analogue to digital converter to provide much greater precision and if desired enables dual slope conversion with, for example fast attack and slow decay.

What is claimed is:

1. A measurement and display device for simultaneously dsplaying two parameters, comprising:
    means for receiving a first and second parameter to be simultaneously displayed;
    sampling means, coupled to said receiving means, for sampling said parameters, to provide a first and second new sample value;
    means for displaying a first and second current sample value of said first and second parameters;
    first comparing means, coupled to said sampling means and said displaying means, for respectively comparing said first and second new sample values and said first and second current sample value, and for providing a first and second comparision signal;
    second comparing means, coupled to said first comparing means, for respectively comparing said first and second comparison signal with a first and second predetermined threshold, and for limiting changes in said first and second current sample value to a predetermined maximum change.

2. The device of claim 1, wherein said first parameter is forward radio frequency power measured at a antenna of a radio transmitter, and said second parameter is reflected power measured at said antenna.

3. The device of claim 1, which includes a second plurality of display segments for indicating the full range of said first parameter.

4. The device of claim 3, wherein said display segments comprise liquid crystal display segments.

5. The device of claim 3, wherein said display segments comprise light emitting diodes.

6. The device of claim 1, wherein said display means comprises a plurality of display segments each having a first and second display state, said segments being changed from said first state to said second state in response to an increase in said first current sample value, and said segments being changed from said second state to said first state in response to an increase in said second current sample value, whereby said first and second sample values are simultaneously displayed.

7. The device of claim 6, wherein said first display state is an "off" state, and said second display state is an "on" state.

8. The device of claim 6, wherein said display segments comprise liquid crystal display segments.

9. The device of claim 6, wherein said display segments comprise light emitting diodes.

10. The device of claim 6, wherein predetermined maximum change comprises a predetermined number of plurality of segments.

11. The device of claim 10, wherein said predetermined maximum change is one segment.

12. The device of claim 1, which further includes means for measuring said first and second parameters and providing a respective first and second indication of instantaneous value.

13. The device of claim 12, wherein said sampling means samples said instanteous values and determines the maximum value from a group of a predetermined number of of said instantaneous values, which maximum value constitutes said new sampled value.

14. The device of claim 1, wherein said first comparing means determines whether said new sample value is greater than, less that or equal to said current sample value thereby indicating an increasing, decreasing or zero change.

15. The device of claim 14, wherein said second comparing means compares an increasing change with a predetermined maximum increasing change and a decreasing change with a predetermined maximum decreasing change.

16. The device of claim 15, wherein said predetermined maximum increasing change and said maximum decreasing change are equal.

17. The device of claim 1, wherein said first and second comparing means comprises a microprocessor.

* * * * *

UNITED STATES PATENT AND TRADEMARK OFFICE
CERTIFICATE OF CORRECTION

PATENT NO. : 4,703,259

DATED : October 27, 1987

INVENTOR(S) : Shlomo Berliner; Areyh Vered; Reich Shmuel and Moshe Vaige

It is certified that error appears in the above-identified patent and that said Letters Patent is hereby corrected as shown below:

Column 4, line 48 "dsplaying" should be --displaying--.

Column 6, line 13, the word "of" should be deleted.

Signed and Sealed this

Fifth Day of April, 1988

Attest:

DONALD J. QUIGG

Attesting Officer

Commissioner of Patents and Trademarks